US010050320B2

(12) United States Patent
Jiang et al.

(10) Patent No.: US 10,050,320 B2
(45) Date of Patent: Aug. 14, 2018

(54) INTEGRATED CIRCUIT WITH SHARED ELECTRODE ENERGY STORAGE DEVICES

(71) Applicant: Analog Devices, Inc., Norwood, MA (US)

(72) Inventors: Yangqi Jiang, Woburn, MA (US); Kuang L. Yang, Newton, MA (US)

(73) Assignee: Analog Devices, Inc., Norwood, MA (US)

( * ) Notice: Subject to any disclaimer, the term of this patent is extended or adjusted under 35 U.S.C. 154(b) by 349 days.

(21) Appl. No.: 14/593,230

(22) Filed: Jan. 9, 2015

(65) Prior Publication Data

US 2016/0204492 A1 Jul. 14, 2016

(51) Int. Cl.

*H01M 16/00* (2006.01)
*H01G 11/22* (2013.01)
*H01M 10/0525* (2010.01)
*H01L 27/06* (2006.01)
*H01L 49/02* (2006.01)
*H01L 23/58* (2006.01)
*H01G 11/56* (2013.01)
*H01G 11/08* (2013.01)

(Continued)

(52) U.S. Cl.

CPC ............ *H01M 16/00* (2013.01); *H01G 11/08* (2013.01); *H01G 11/22* (2013.01); *H01G 11/56* (2013.01); *H01L 23/58* (2013.01); *H01L 27/0629* (2013.01); *H01L 27/0676* (2013.01); *H01L 28/60* (2013.01); *H01M 10/0525* (2013.01); *H01M 12/005* (2013.01); *H01L 2924/0002* (2013.01); *H01M 4/525* (2013.01); *H01M 2220/30* (2013.01); *Y02E 60/13* (2013.01)

(58) Field of Classification Search

CPC .............................. H01M 16/00; H01G 11/08

See application file for complete search history.

(56) References Cited

U.S. PATENT DOCUMENTS

| | | | | |
|---|---|---|---|---|
| 5,079,674 | A | 1/1992 | Malaspina | 361/502 |
| 5,439,756 | A | 8/1995 | Anani et al. | 429/9 |
| 6,117,585 | A | 9/2000 | Anani et al. | 429/122 |

(Continued)

FOREIGN PATENT DOCUMENTS

| | | | | |
|---|---|---|---|---|
| CN | 202353290 | U | 7/2012 | H02J 7/34 |
| CN | 102800734 | A | 11/2012 | |

(Continued)

OTHER PUBLICATIONS

Zhong-Shuai Wu et al., "Graphene-based in-plane micro-supercapacitors with high power and energy densities" Nature Communications, vol. 4, Article #2487, 1-8, Sep. 17, 2013.*

(Continued)

*Primary Examiner* — Su C Kim
*Assistant Examiner* — David S Wilbert
(74) *Attorney, Agent, or Firm* — Wolf, Greenfield & Sacks, P.C.

(57) ABSTRACT

An integrated circuit has a substrate, a super-capacitor supported by the substrate, and a battery supported by the substrate. The super-capacitor includes a super-capacitor electrode and a shared electrode, and the battery has a battery electrode and the prior noted shared electrode. The super-capacitor and battery form at least a part of a monolithic integrated circuit.

20 Claims, 6 Drawing Sheets

22C
22B
22A

(51) Int. Cl.

| | |
|---|---|
| ***H01M 12/00*** | (2006.01) |
| *H01M 4/525* | (2010.01) |

(56) References Cited

U.S. PATENT DOCUMENTS

| | | | | |
|---|---|---|---|---|
| 6,356,432 | B1 | 3/2002 | Danel et al. | 361/502 |
| 6,621,687 | B2 | 9/2003 | Lewis, Jr. et al. | 361/511 |
| 7,061,749 | B2 | 6/2006 | Liu et al. | 361/502 |
| 7,294,209 | B2 | 11/2007 | Shakespeare | 118/729 |
| 7,659,014 | B2 | 2/2010 | Sohn | 429/7 |
| 7,852,612 | B2 | 12/2010 | Zhao | 361/502 |
| 8,503,161 | B1 | 8/2013 | Chang et al. | 361/502 |
| 8,697,516 | B2 | 4/2014 | Furukawa et al. | 438/240 |
| 8,778,800 | B1 | 7/2014 | Chang et al. | 438/685 |
| 9,725,798 | B2 | 8/2017 | Lee et al. | H01G 9/0029 |
| 2001/0020319 | A1 | 9/2001 | Farahmandi et al. | 29/25.03 |
| 2003/0035982 | A1 | 2/2003 | Ryu et al. | 429/7 |
| 2004/0161640 | A1 | 8/2004 | Salot | 429/9 |
| 2004/0185310 | A1* | 9/2004 | Jenson | A61N 1/3787 429/7 |
| 2008/0199737 | A1 | 8/2008 | Kazaryan et al. | 429/9 |
| 2010/0195261 | A1 | 8/2010 | Sweeney et al. | 361/313 |
| 2010/0328845 | A1 | 12/2010 | Hiralal et al. | 361/502 |
| 2010/0330433 | A1 | 12/2010 | Amine et al. | 429/302 |
| 2011/0019337 | A1 | 1/2011 | Chen et al. | 361/500 |
| 2011/0183180 | A1 | 7/2011 | Yu et al. | 428/128 |
| 2012/0026643 | A1 | 2/2012 | Yu et al. | 361/502 |
| 2012/0092809 | A1 | 4/2012 | Tamachi et al. | 361/502 |
| 2012/0216379 | A1 | 8/2012 | Martienssen et al. | 29/25.41 |
| 2013/0182373 | A1 | 7/2013 | Yu et al. | 361/502 |
| 2014/0035098 | A1 | 2/2014 | Dunn et al. | 257/532 |
| 2014/0321093 | A1 | 10/2014 | Pande et al. | 361/807 |
| 2016/0064149 | A1 | 3/2016 | Jiang et al. | H01H 9/0029 |
| 2016/0064155 | A1 | 3/2016 | Jiang et al. | H01G 11/52 |
| 2016/0104581 | A1 | 4/2016 | Jiang et al. | H01G 11/28 |
| 2016/0148759 | A1* | 5/2016 | El-Kady | H01G 11/36 428/178 |

FOREIGN PATENT DOCUMENTS

| | | | | |
|---|---|---|---|---|
| CN | 202957152 | U | 5/2013 | H01G 11/08 |
| CN | 103219162 | A | 7/2013 | H01G 11/36 |
| JP | 2010-161097 | A | 7/2010 | H01G 9/155 |
| JP | 2012-033899 | A | 2/2012 | H01G 11/06 |
| KR | 10-1057410 | B1 | 8/2011 | H01G 9/058 |
| KR | 10-1222873 | B1 | 1/2013 | H01G 2/06 |
| WO | WO 2013/070989 | A1 | 5/2013 | H01G 11/30 |

OTHER PUBLICATIONS

El-Kady et al., "Scalable fabrication of high-power graphene micro-supercapacitors for flexible and on-chip energy storage," Nature Communications, vol. 4, Article No. 1475, 9 pages, dated Feb. 12, 2013.

Wu et al., "Graphene-based in-plane micro- supercapacitors with high power and energy densities," Nature Communications, vol. 4, Article No. 2487, 8 pages , dated Sep. 17, 2013.

Pech et al., "Research Topics—ISGE," Laboratory for Analysis and Architecture of Systems, https://www.laas.fr/public/en/research-topics-isge, 5 pages, 2014.

Israel Patent Office Authorized Officer: Orgad, Yaniv, Notification of Transmittal of the International Search Report and the Written Opinion of the International Searching Authority, or the Declaration; PCT/US2015/060530, 10 pages, dated Feb. 25, 2016.

* cited by examiner

22B
FIG. 7A
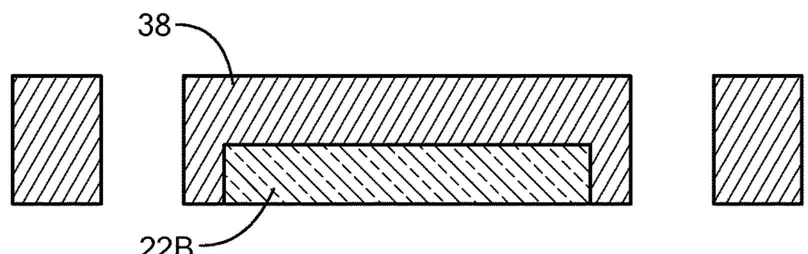
FIG. 7B
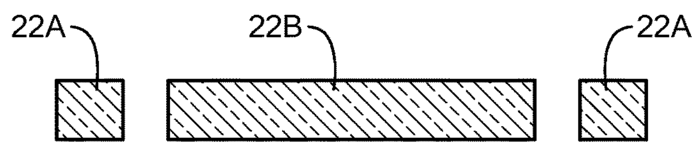
FIG. 7C
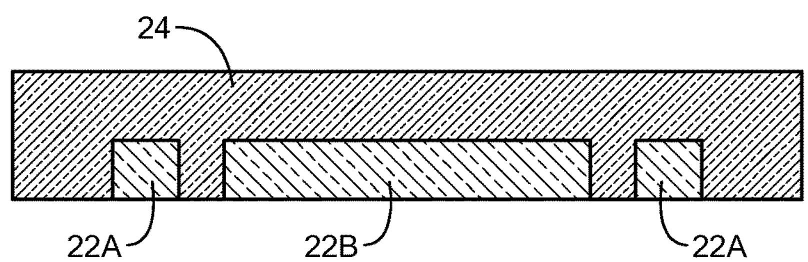
FIG. 7D
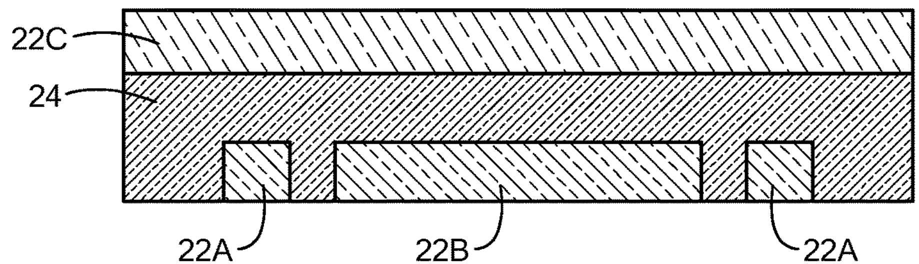
FIG. 7E

INTEGRATED CIRCUIT WITH SHARED ELECTRODE ENERGY STORAGE DEVICES

REFERENCE TO RELATED PATENT APPLICATIONS

This patent application is related to the following patent applications, each of which is incorporated herein, in its entirety, by reference:

U.S. patent application Ser. No. 14/469,004, filed Aug. 26, 2014, entitled, "METHOD OF PRODUCING A SUPER-CAPACITOR," and naming Yingqi Jiang and Kuang L. Yang as inventors, U.S. patent application Ser. No. 14/492,376, filed Sep. 22, 2014, entitled, "SUPER-CAPACITOR WITH SEPARATOR AND METHOD OF PRODUCING THE SAME," and naming Yingqi Jiang and Kuang L. Yang as inventors, U.S. patent application Ser. No. 14/509,950, filed Oct. 8, 2014, entitled, "INTEGRATED SUPER-CAPACITOR," and naming Yingqi Jiang and Kuang L. Yang as inventors.

FIELD OF THE INVENTION

The invention generally relates to integrated circuits and, more particularly, the invention relates to energy storage devices on integrated circuits.

BACKGROUND OF THE INVENTION

Although the size of portable electronic devices continues to shrink, their energy requirements often do not comparably decrease. For example, a next-generation MEMS accelerometer may have a volume that is 10 percent smaller and yet, require are only 5 percent less power than the prior generation MEMS accelerometer. In that case, more of the MEMS die may be used for energy storage. Undesirably, this trend can limit miniaturization and applicability of such electronic devices.

The art has responded to this problem by developing chip-level super-capacitors (also known as "micro super-capacitors"), which have much greater capacitances than conventional capacitors. In a manner similar to conventional capacitors, super-capacitors generally have higher power densities than batteries. Undesirably, however, super-capacitors generally have lower storage capabilities than batteries.

SUMMARY OF VARIOUS EMBODIMENTS

In accordance with one embodiment of the invention, an integrated circuit has a substrate, a super-capacitor supported by the substrate, and a battery supported by the substrate. The super-capacitor includes a super-capacitor electrode and a shared electrode, and the battery has a battery electrode and the prior noted shared electrode. The super-capacitor and battery form at least a part of a monolithic integrated circuit.

The battery and super-capacitor may be electrically connected in parallel. Moreover, the shared electrode may be formed at least in part from a material so that it has surface energy storage capability (i.e., an electrode of this type is used for a super-capacitor, such as graphene) and substantially no volumetric storage capability (i.e., an electrode of this type is for a battery, such as graphite). The shared electrode in that case may form a shared anode for both the super-capacitor and the battery. In that case, among other cases, the super-capacitor electrode and shared electrode can have about the same capacitance. As another example, the shared anode embodiment may have three respective electrodes comprising graphene (super-capacitor), graphene (shared anode), and lithium cobalt oxide (battery cathode).

In contrast, the shared electrode may include a material having both surface energy storage capability and volumetric energy storage capability. In that case, the super-capacitor may form an asymmetric super-capacitor with the shared electrode, thus forming a shared cathode for the super-capacitor and the battery. For example, the shared cathode embodiment may have three respective electrodes comprising graphene (super-capacitor), and lithium cobalt oxide (shared cathode), and metal lithium (battery anode).

In some embodiments, at least one of active circuitry and MEMS structure also is/are supported by the substrate and in electrical communication with the battery and the super-capacitor. For example, the integrated circuit may include switching circuitry to switch between at least a) a first state using the battery only, and b) a second state using the super-capacitor only. Moreover, the integrated circuit may include a plurality of layers, and at least one of the layers may include two of the electrodes. Accordingly, both of these same-layer electrodes may be formed by the same processing/microfabrication step.

The electrodes may be shaped and oriented in a wide variety of geometries. For example, the super-capacitor electrode may have a portion that is interdigitated with a portion of the battery electrode.

In accordance with another embodiment of the invention, a micro-level energy storage device has a substrate, a first electrode formed from a material having surface energy storage capability (but no volumetric energy storage capability), and a second electrode formed from a material having volumetric energy storage capability. The device also has a third electrode formed from a material having one or both surface energy storage capability and volumetric energy storage capability, and an electrolyte in communication with the first electrode, the second electrode, and the third electrode. The first electrode is configured to interact with the third electrode to form first energy storage device and, in a similar manner, the second electrode is configured to interact with the third electrode to form a second energy storage device. The substrate, first electrode, second electrode, and third electrode form at least a part of a monolithic integrated circuit.

In accordance with other embodiments, a method of forming an integrated circuit having an energy storage device forms first, second, and third electrodes on a substrate, and adds an electrolyte to the substrate so that the electrolyte at least partly encapsulates the first and second electrodes. The third electrode is spaced from the first and second electrodes. The electrolyte is between the first electrode and the third electrode, and between the second electrode and the third electrode. The method also separates (e.g., through cutting, dicing, breaking, or other conventional technique) the substrate into a plurality of individual monolithic integrated circuit dice/dies. A plurality of the dice have the first electrode, the second electrode, and the third electrode. Moreover, that plurality of dice each are configured so that the first electrode interacts with the third electrode to form first energy storage device, and so that the second electrode interacts with the third electrode to form a second energy storage device.

BRIEF DESCRIPTION OF THE DRAWINGS

Those skilled in the art should more fully appreciate advantages of various embodiments of the invention from the following "Description of Illustrative Embodiments," discussed with reference to the drawings summarized immediately below.

FIG. 7A schematically shows a cross-sectional view of the process of FIG. 6 through step 600.

FIG. 7B schematically shows a cross-sectional view of the process of FIG. 6 through step 602.

FIG. 7C schematically shows a cross-sectional view of the process of FIG. 6 through step 604.

FIG. 7D schematically shows a cross-sectional view of the process of FIG. 6 through step 606.

FIG. 7E schematically shows a cross-sectional view of the process of FIG. 6 through step 608.

DESCRIPTION OF ILLUSTRATIVE EMBODIMENTS

In illustrative embodiments, an integrated circuit has a shared energy device with a super-capacitor and battery that together share a common electrode. Depending on the design, the common electrode can form either a common anode or a common cathode. Such a shared energy device therefore can respond to high-power spikes from an underlying device or circuit while still delivering effective long-term energy storage needs. Details of illustrative embodiments are discussed below.

Figure 1:
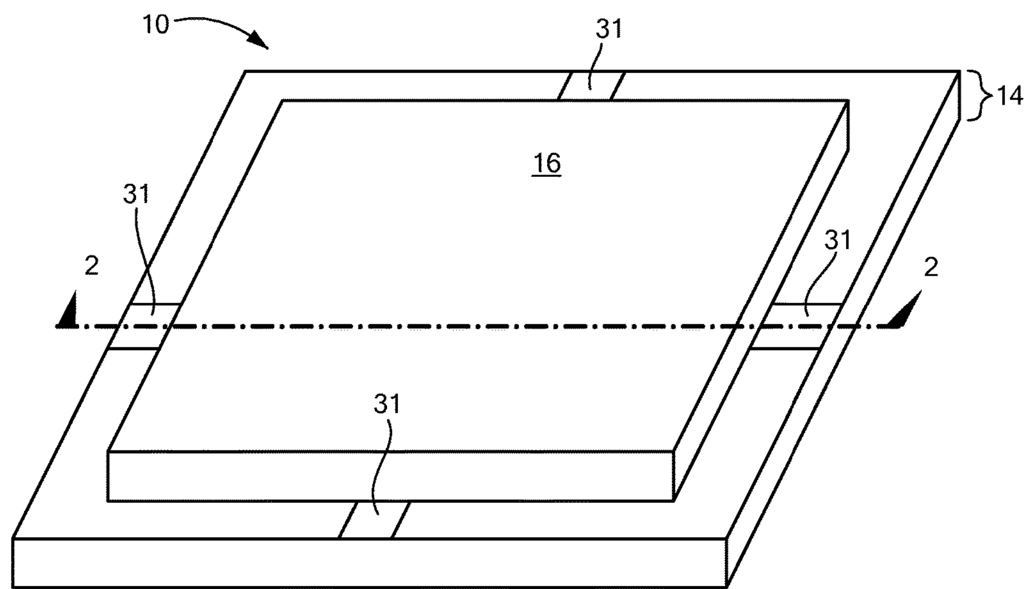
FIG. 1 schematically shows a perspective view of an integrated circuit having a shared energy device that may be configured in accordance with illustrative embodiments of the invention.
Figure 2:
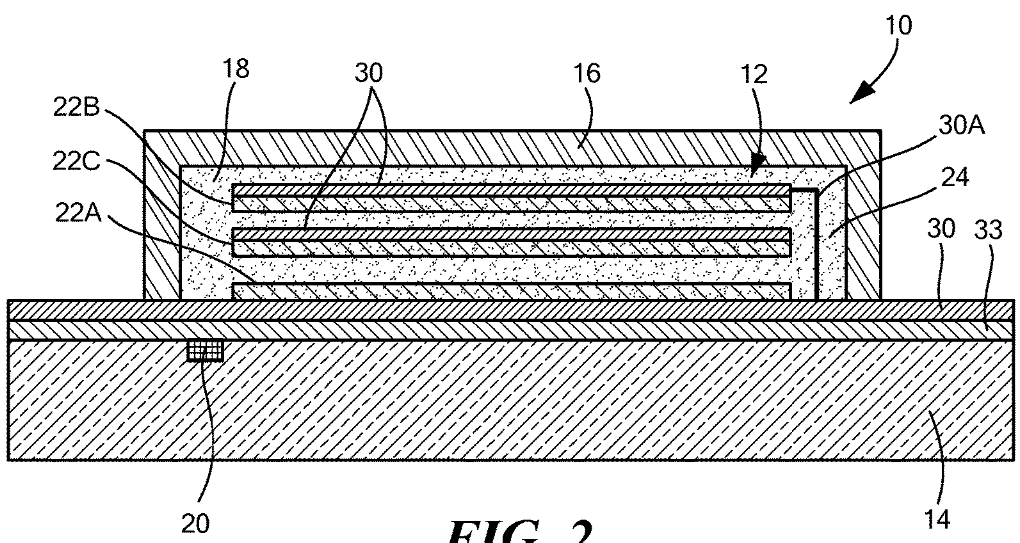
FIG. 2 schematically shows a cross-sectional view of the integrated circuit shown in FIG. 1 across line 2-2.

FIG. 1 schematically shows a perspective view of an integrated circuit 10 having a shared energy device 12 configured in accordance with illustrative embodiments of the invention. FIG. 2 schematically shows one embodiment of a cross-sectional view of the integrated circuit 10 along line 2-2 of FIG. 1. As shown, the integrated circuit 10 may be considered to be a monolithic, unitary chip-level device having a multilayer substrate 14 supporting a cap 16 that together form an interior chamber 18. Among other things, the interior chamber 18 has a plurality of electrodes 22A-22C and electrolyte material(s) 24 that together form a super-capacitor 26 and a battery 28. In other words, the electrodes 22A-22C and electrolyte material 24 cooperate to have the capacity to store a prescribed electrical charge.

The interior chamber 18 also may have internal circuitry 20, which may include any of a wide variety of different devices commonly formed on an integrated circuit. Among other things, the circuitry 20 can contain active circuit devices (e.g., diodes and transistors) and/or passive circuit devices (resistors, and inductors, and standard capacitors) that together provide the desired functionality. For example, the circuitry 20 can form one or more of a digital signal processor, a controller, a microprocessor, and adder, a digital-to-analog converter, and/or memory. In addition or alternatively, the integrated circuit 10 also may have movable microstructure and thus, form a microelectromechanical system (i.e., a MEMS device).

In some embodiments, the circuitry 20 may include one or more additional batteries and/or super-capacitors that do not share an electrode. Further embodiments may have more shared energy devices 12 similar to those discussed above and below. Accordingly, illustrative embodiments are not limited to integrated circuits 10 having one shared energy device 12 only. For simplicity, FIG. 2 generically identifies both the circuitry (e.g., additional batteries, super-capacitors, converters, etc.) and microstructure schematically by reference number 20.

The electrode used only for the super-capacitor 26 is referred to herein as a "super-capacitor electrode 22A" (FIG. 2), while the electrode used only for the battery 28 only is referred to herein as a "battery electrode 22B" (FIG. 2). The electrode shared by both the super-capacitor 26 and the battery 28 simply is referred to herein as a "shared electrode 22C" (FIG. 2). As discussed below, these electrodes 22A-22C are formed on the substrate 14, which has an insulation layer 33.

In the embodiment shown in FIG. 2, the shared electrode 22C is sandwiched between the battery electrode 22B and the super-capacitor electrode 22A—essentially a "stacked" electrode arrangement. Thus, the battery electrode 22B and shared electrode 22C interact to form the battery 28, while the super-capacitor electrode 22A and shared electrode 22C interact to form the super-capacitor 26. In some embodiments, the shared electrode 22C and super-capacitor electrode 22A interact to form what is known in the art as an "asymmetric super-capacitor." As discussed in greater detail below, a stacked configuration like that shown in FIG. 2 is but one of a wide variety of different electrode configurations.

To improve conductivity and provide exterior access to the electrodes 22A-22C, illustrative embodiments form current collector layers 30. Each current collector layer 30 is in electrical contact with one of the electrodes 22A-22C. In addition, the current collector layers 30 are in electrical communication with conductive contacts 31 on the exterior of the integrated circuit 10. Some embodiments form the conductive contacts 31 by elongating the current collector layers 30 to the outside of the interior chamber 18. Among other things, the current collector layer 30 may be formed from a highly conductive metal, such as gold, or a highly doped semiconductor, such as polysilicon. Those skilled in the art can select other materials for this purpose.

In preferred embodiments, the battery electrode 22B and the super-capacitor electrode 22A are maintained at substantially the same potential through a connection represented schematically by reference number 30A. Although this connection 30A is shown schematically as a simple line, those skilled in the art can use any of a number of different techniques for making that connection. Some embodiments, however, may not maintain the battery electrode 22B and super-capacitor electrode 22A at the same potential.

The electrodes 22A and 22B respectively used for the super-capacitor 26 and battery 28 may be formed from conventional materials known in the art. More specifically, to improve surface charge storage capacity, the super-capacitor electrode 22A preferably is formed from a porous material. For example, the super-capacitor electrode 22A may be formed from graphene, which is known to be a porous material with tortuous interior and exterior surfaces. Virtually every surface of the super-capacitor electrode 22A exposed to the electrolyte 24 therefore may be considered part of the surface area of the capacitor plates represented in the well-known equation:

$$C=\varepsilon*(A/D) \quad \text{(Equation 1)},$$

where:

C is capacitance,

ε is a constant,

A is the area, and

D is distance.

Indeed, those skilled in the art can use other materials to form the super-capacitor electrode 22A, such as activated carbon, carbon aerogel, or carbon nanotubes, to name but a few. Some embodiments may from the super-capacitor electrode 22A from a plurality of graphene monolayers. Accordingly, discussion of a layer of graphene is by example only and not intended to limit various other embodiments of the invention.

As known by those skilled in the art, the super-capacitor electrode 22A has surface energy storage capability. In particular, this electrode has the quality of being capable of storing charge at its surface. In contrast, however, the super-capacitor electrode 22A does not have the effective ability to store charge/power an appreciable distance beneath its surface; i.e., at the molecular level within the larger volume of material forming the super-capacitor electrode 22A.

Super-capacitors therefore typically are considered to have a negligible "volumetric energy storage capacity." As such, when compared to batteries, super-capacitors are known to have a lower capability for storing energy/charge. Despite this shortcoming, super-capacitors also are known to have the capability of generally providing higher power densities than those of comparably sized batteries. The super-capacitor 26 thus should be useful when a circuit powered by the battery 28 demands a very high current/power for a short time (a power "spike"). As discussed in more detail below, the shared energy device 12 has the capability to provide both adequate power during spikes, and substantial energy storage capability during steady state operation.

The battery electrode 22B may be formed from any conventional material having a non-negligible volumetric energy storage capability. For example, among other things, the battery electrode 22B may be formed at least in part from graphite or lithium. Moreover, although it has substantial volumetric energy storage capacity, the battery electrode 22B also may store some of its energy/charge at or near its surface.

Those skilled in the art can select any of a variety of materials for the shared electrode 22C. Some embodiments may form the shared electrode 22C from a material better suited for a super-capacitor application. For example, the shared electrode 22C may act as an anode formed from graphene. In that case, illustrative embodiments may form the shared electrode 22C to have about the same capacitance as that of the super-capacitor electrode 22A.

Other embodiments, however, may form the shared electrode 22C from a material better suited for a battery application. For example, the shared electrode 22C may act as a cathode formed from lithium cobalt oxide ($LiCoO2$). In the latter case, the super-capacitor electrode 22A and shared electrode 22C may be considered to form an asymmetric super-capacitor (suggested above). Accordingly, the shared electrode 22C may have both surface energy storage capacity and volumetric energy storage capacity, or surface energy storage capacity only. Indeed, as noted above, those skilled in the art can select an appropriate material for the shared electrode 22C and thus, the materials discussed above are mentioned for illustrative purposes only.

The electrolyte 24 can be formed from any of a wide variety of other corresponding materials typically used in powering applications. For example, electrolyte 24 can be formed from an aqueous salt, such as sodium chloride, or a gel, such as a polyvinyl alcohol polymer soaked in a salt. Additional examples include lithium tetrafluoroborate ($LiBF4$) or lithium hexafluorophosphate ($LiPF6$) plus polypyrole). Some embodiments may use an ionic liquid, in which ions are in the liquid state at room temperature. Although not necessarily aqueous, such electrolytes are known to be extremely conductive due to the relatively free movement of their ions. The inventors believe that such an electrolyte 24 should cause the super-capacitor 26 to have a relatively high energy storage capacity because, as known by those skilled in the art, the energy storage of a capacitor is a function of the square of the voltage.

As noted, the electrolyte 24 preferably is generally integrated with both the internal and external surfaces of one or more of the electrodes 22A-22C. Among other things, the internal surfaces may be formed by tortuous internal channels and pores within the electrodes 22A-22C. The external surfaces simply may be those surfaces visible from the electrode exteriors. The electrolyte 24 and noted electrode surfaces thus are considered to form an electrode/electrolyte interface that stores energy.

Depending upon the electrode material, electrons can flow somewhat freely within the electrodes 22-22C. For example, electrons can flow within graphene of the super-capacitor electrode 22A. The electrolyte 24, however, acts as an insulator and thus, does not conduct the electrons from the super-capacitor electrode 22A. In a corresponding manner, the electrolyte 24 has ions that can migrate somewhat freely up to the noted interface with the super-capacitor electrodes 22A. Like electrons in the super-capacitor electrode 22A, ions in the electrolyte 24 do not migrate through the interface.

Continuing with the super-capacitor electrode example, when subjected to an electric field, ions within the electrolyte 24 migrate to align with the electric field. This causes electrons and holes in the super-capacitor electrode 22A to migrate in a corresponding manner, effectively storing charge. For example, in a prescribed electric field, positive ions in the electrolyte 24 may migrate toward a first super-capacitor electrode surface, and the negative ions in the electrolyte 24 may migrate toward a second super-capacitor electrode surface. In that case, the positive ions near the first super-capacitor electrode surface attract electrons (in the electrode 22A) toward that interface, while the negative ions near the second super-capacitor electrode surface attract holes (in the electrode 22A) for that interface. The distance of the ions to the interface plus the distance of the electrons to the same interface (on the opposite side of the interface) represent distance "d" of Equation 1 above.

As noted above, the battery electrode and the super-capacitor electrode 22B and 22A preferably are fixed at the same potential. Accordingly, as parallel-connected devices, the shared energy device 12 (i.e., the super-capacitor 26 and battery 28) effectively may meet both short-term power spike/surge needs and long-term power needs. Other embodiments, however, may include switching circuitry to selectively connect and disconnect the battery 28 and/or super-capacitor 26 from an underlying circuit.

Figure 3:
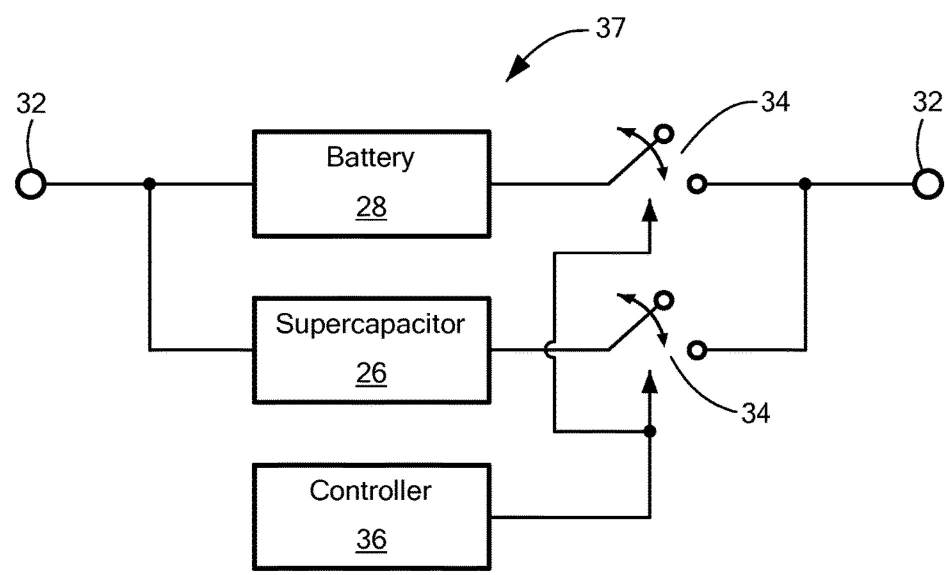
FIG. 3 schematically shows a diagram of the electrical connections of an internal battery and super-capacitor within the integrated circuit of FIG. 1.

To those ends, FIG. 3 schematically shows a diagram of the electrical connections of the battery 28 and super-capacitor 26 within the integrated circuit 10 of FIG. 1—a power circuit 37. More specifically, the power circuit 37 has circuit interfaces 32 that together receive power from the combined shared energy device 12. Other circuits thus may connect to the two interfaces 32 for receiving the power. The power circuit 37 also has one or more switches 34, along with a switch controller 36, for selectively connecting the battery 28 and the super-capacitor 26 between four different states. Those four states include:

1) Parallel State: both the battery 28 and super-capacitor 26 are in the power circuit 37—both switches 34 are closed, 2) Battery State: only the battery 28 is in the power circuit 37—only the switch 34 for the battery 28 is closed, 3) Super-capacitor state: only the super-capacitor 26 is the power circuit 37—only the switch 34 for the super-capacitor 26 is closed, and 4) Disconnected State: neither the battery 28 nor the super-capacitor 26 is in the power circuit 37—both switches 34 are open.

The switch controller 36 may control the switches 34 for any of a wide variety of power management functions. Among other ways, the switch controller 36 can receive switch control input from other circuit components, or have preprogrammed instructions to make the appropriate switching connections in the power circuit 37. The switch controller 36 thus can be formed from a wide variety of conventional switching designs, such as those using passive or active circuitry.

Figure 4B:
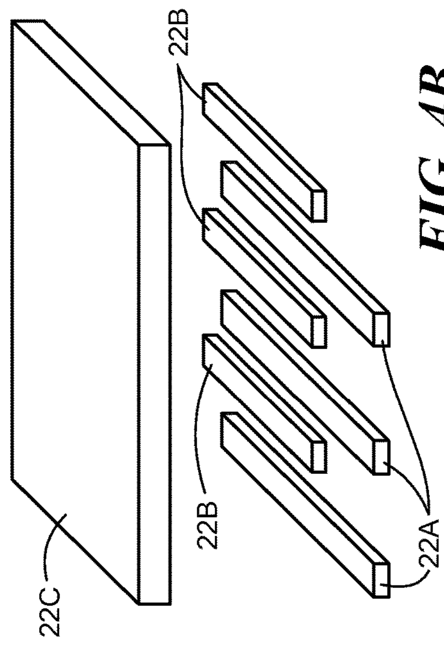
FIG. 4B schematically shows a second interdigitated arrangement of electrodes configured in accordance with illustrative embodiments of the invention.
Figure 4C:
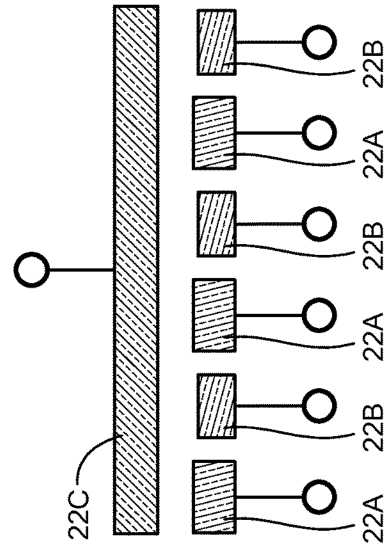
FIG. 4C schematically shows a cross-sectional view of the electrode implementations of FIGS. 4A and 4B.
Figure 4A:
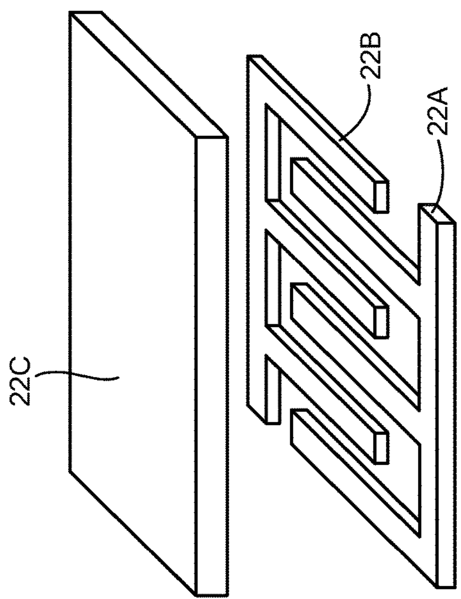
FIG. 4A schematically shows a first interdigitated arrangement of electrodes configured in accordance with illustrative embodiments of the invention.

As noted above, the stacked electrode configuration of FIG. 2 is but one of a wide variety of potentially viable electrode configurations for the shared energy device 12. FIGS. 4A and 4B schematically show the electrode arrangements of two related but different embodiments having overlapping shapes. This overlapping is often referred to in the art as "interdigitating," in a manner similar to the interlacing one's fingers. More specifically, the battery and super-capacitor electrodes 22B and 22A in FIGS. 4A and 4B are formed in the noted overlapping configuration within same plane of the integrated circuit 10.

In the embodiment of FIG. 4A, the battery electrode 22B is a single, unitary electrode. In a similar manner, the super-capacitor electrode 22A of FIG. 4A also has a single, unitary electrode. This is in contrast to the embodiment of FIG. 4B, in which the battery electrode 22B is formed by three separate and physically unconnected battery electrodes 22B (they may be electrically connected). In a corresponding manner, the super-capacitor electrode 22A of FIG. 4B also is formed by three separate and physically unconnected super-capacitor electrodes 22A. Like the separate electrodes forming the battery electrode 22B, the electrodes of the super-capacitor electrode 22A may be electrically connected. For convenience, each of these electrodes 22A and 22B is referred to as a "finger." FIG. 4C schematically shows a cross-section of the electrodes 22A-22C across a plane that is substantially perpendicular to the plane of the substrate 14.

The embodiment of FIG. 4B thus permits power management circuitry (not shown) to selectively connect the various fingers as needed. For example, during system startup, to quickly boost system voltage from zero to usable level for a given application, controlling circuitry may charge and connect only a few super-capacitor fingers to the system. As the voltage increases, controlling circuitry may gradually charge and introduce more super-capacitor fingers to the system. After the super-capacitor 26 fully charges and provides the initial power, the battery 28 may act as the primary power source. Moreover, if the battery and/or super-capacitor fingers has a defect or otherwise malfunctions, then controlling circuitry may remove that finger from the system. While this solution may reduce power delivery capacity, it still may provide enough power for the given application.

Figure 5A:
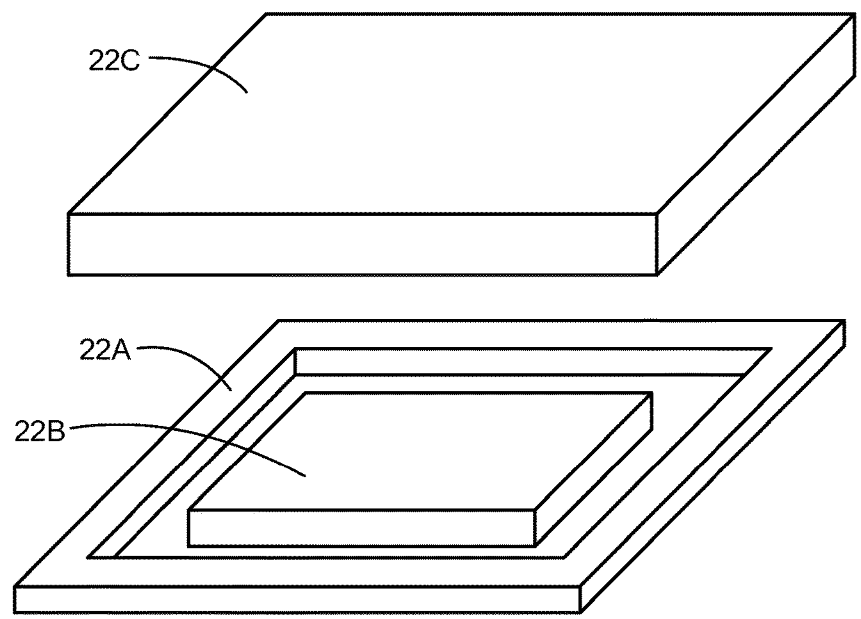
FIG. 5A schematically shows a perspective, exploded view of another electrode arrangement configured in accordance with illustrative embodiments of the invention.
Figure 5B:
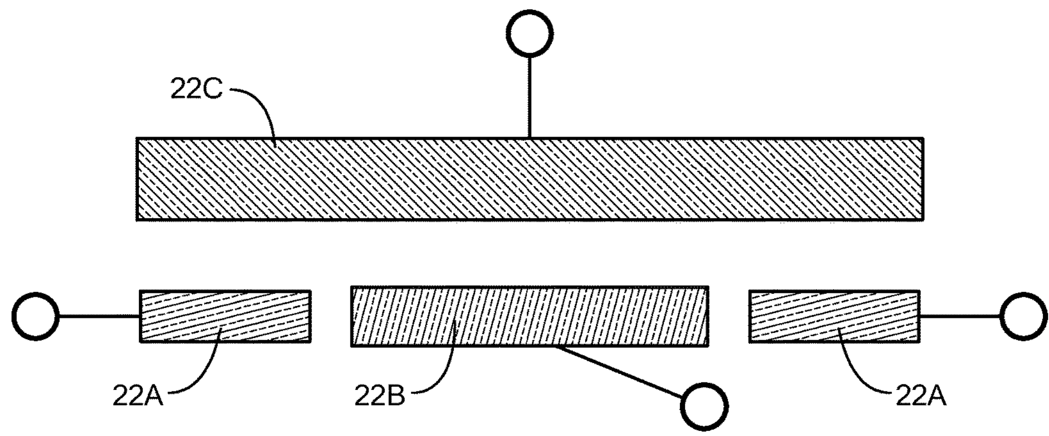
FIG. 5B schematically shows a cross-sectional view of the electrode arrangement of FIG. 5A.

FIGS. 5A and 5B schematically show another electrode configuration in which the super-capacitor electrode 22A and the battery electrode 22B also are formed in the same plane of the integrated circuit 10. In this case, the super-capacitor electrode 22A circumscribes the battery electrode 22B, while the shared electrode 22C is formed in a different layer/plane of the integrated circuit 10. Indeed, this embodiment alternatively can circumscribe the battery electrode 22B about the super-capacitor electrode 22A, or circumscribe one of the battery or super-capacitor electrodes 22B or 22A about the shared electrode 22C. In the latter case, the other electrode 22A or 22B is in another plane. It should be noted that discussion of the specific electrode configurations, such as those in FIGS. 2, 4A-4C and 5A-5B, are but a few of a wide variety of different electrode configurations that may prove effective. Accordingly, those skilled in the art can apply principles of illustrative embodiments to form different electrode configurations that incorporate the spirit of those embodiments.

Figure 6:
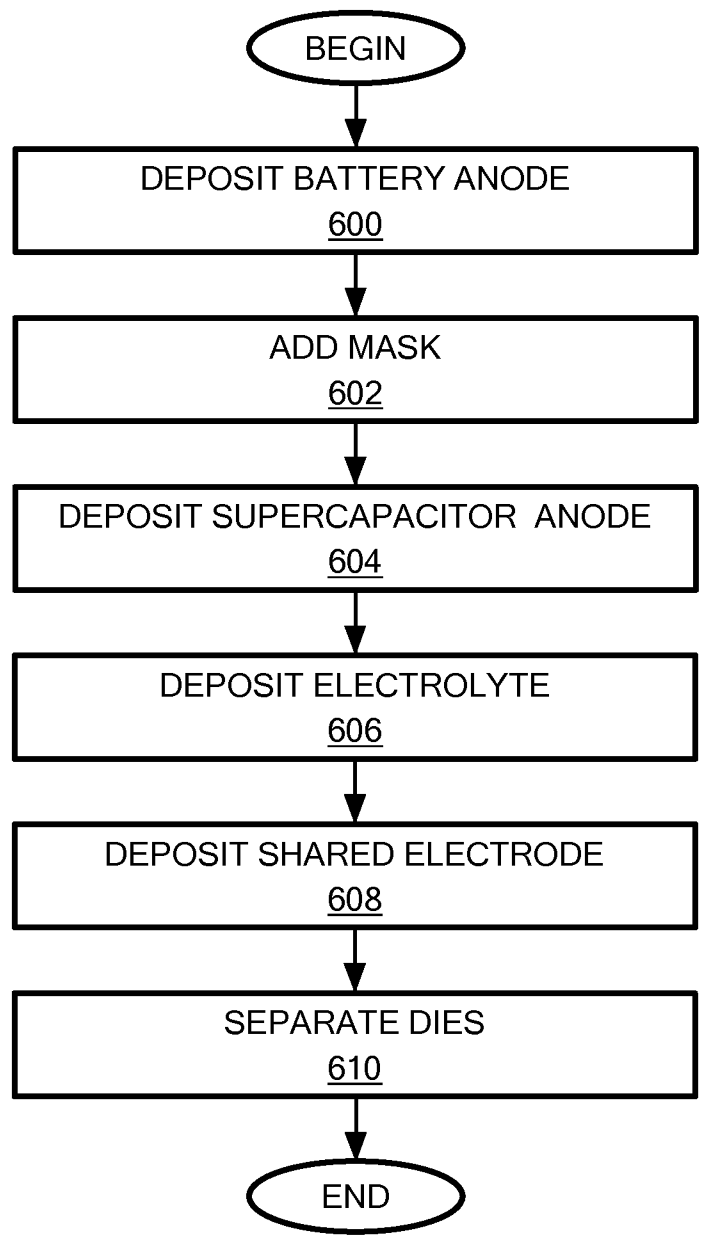
FIG. 6 shows a process of forming a monolithic integrated circuit having a shared energy device configured in accordance with illustrative embodiments of the invention.

FIG. 6 shows a process of fabricating the integrated circuit 10 in accordance with illustrative embodiments of the invention. In this example, the integrated circuit 10 has an electrode configuration like that of FIGS. 5A and 5B. It should be noted that this process is substantially simplified from a longer process that normally would be used to form the integrated circuit 10 and its shared energy device 12. Accordingly, the process of forming the integrated circuit 10 has many steps, such as adding the noted current collector layers 30, testing the individual dice, or additional passivation steps that those skilled in the art may use. In addition, some of the steps may be performed in a different order than that shown, or at the same time. Those skilled in the art therefore can modify the process as appropriate.

It also should be noted that the process of FIG. 6 is a bulk process, which forms a plurality of integrated circuits 10 on the same wafer/base at the same time. Although typically less efficient, those skilled in the art can apply these principles to a process that forms only one integrated circuit 10.

The process begins at step 600, which deposits and patterns the battery electrode 22B on the insulated wafer/substrate 14. For simplicity, the wafer/substrate 14 is not shown in FIGS. 7A-7E. Among other ways, this step may use conventional sputtering or other well-known deposition techniques, as well as conventional patterning techniques, to deposit and pattern the battery electrode 22B. FIG. 7A schematically shows relevant portions of the integrated circuit 10 at the conclusion of this step.

Next, the process coats the battery electrode 22B with a masking material 38, such as photoresist (step 602). Once the masking material 38 cures, step 602 also patterns the masking material 38 into the negative of the intended shape of the super-capacitor electrode 22A. FIG. 7B schematically shows relevant portions of the integrated circuit 10 at the conclusion of this step.

Step 604 then deposits the super-capacitor electrode material onto the masking material 38, and then removes the mask, leaving the two electrodes 22A and 22B in place on the substrate 14. Accordingly, in this embodiment, both electrodes 22A and 22B form anodes of their respective devices and are positioned on the same layer of the integrated circuit 10. FIG. 7C schematically shows the relevant portions of the integrated circuit 10 at the conclusion of this step.

The process continues to step 606, which deposits the electrolyte 24 over both electrodes 22A and 22B. To that end, illustrative embodiments may pour or otherwise deposit a liquid electrolyte onto the exposed top surface, and then apply a vacuum infiltration process to the substrate 14, including to the electrodes 22A and 22B, which draws the liquid electrolyte 24 into the porous electrode material forming the electrodes 22A and 22B.

Illustrative vacuum infiltration processes preferably substantially uniformly distribute the electrolyte 24 within the porous material without damaging the morphology of the electrodes 22A and 22B. Since the electrolyte 24 is in liquid form, heating is not generally necessary at this stage. Some embodiments, however, may omit the vacuum infiltration processes. The step may conclude by permitting the electrolyte 24 to cure.

Rather than using a liquid electrolyte 24, some embodiments spin coat or otherwise deposit a solid/gel electrolyte to the substrate 14. Other embodiments may use other electrolytes. FIG. 7D schematically shows the relevant portions of the integrated circuit 10 at the conclusion of this step.

At this point the process, the solid/gel electrolyte 24 is capable of supporting the shared electrode 22C. Accordingly, using conventional techniques such as sputtering, step 608 deposits the shared electrode 22C onto the surface of the solid electrolyte 24. In this case, the shared electrode 22C acts as a cathode for both the super-capacitor 26 and the battery 28. This step also may pattern the shared electrode 22C if necessary. FIG. 7E schematically shows the relevant portions of the integrated circuit 10 at the conclusion of this step.

After capping (e.g., using the cap 16) or otherwise encapsulating the integrated circuit 10 (e.g., using an in-situ cap), the process concludes at step 610, which separates/singulates the noted integrated circuit dice formed on the substrate 14. Indeed, those skilled in the art can use any of a wide variety of techniques for separating the dice, such as conventional saw or dicing processes along scribe streets or prescribed regions. Other embodiments can use a perforated wafer, or other techniques known in the art. Regardless of the technique, this final step of the process concludes with a plurality of die-level integrated circuit 10 having shared energy devices 12 ready for testing, further processing, or commercial use.

These resulting dice/integrated circuits 10 deliver a number of benefits. For example, as noted above, repeated power spikes can damage the battery 28 under normal operating conditions. Illustrative embodiments can mitigate that battery damage on a micro-chip level by having the super-capacitor 26 respond to spikes—effectively removing the battery 28 from the circuit for the short duration of the spike. The battery 28 thus likely will provide the majority of the power to the circuit in the steady state, while the capacitor primarily handles the power spikes.

Illustrative embodiments therefore can deliver both high energy density and high power functionality on a single, robust integrated circuit 10. By sharing the electrode 22C, such embodiments further can provide both functionalities with a smaller footprint—using less die real estate. This should increase cost effectiveness and permit more devices to be formed on a single substrate 14. In addition, the shared electrode 22C reduces the necessary interconnections between the super-capacitor 26 and the battery 28, correspondingly reducing internal die resistances, favorably reducing internal die power consumption.

Illustrative embodiments therefore provide the combined functionality of the super-capacitor 26 and battery 28 on the micro-level semiconductor scale; namely on a monolithic integrated circuit 10. This new design consequently opens up a wide variety of new applications, enhancing circuit design flexibility and functionality.

Although the above discussion discloses various exemplary embodiments of the invention, it should be apparent that those skilled in the art can make various modifications that will achieve some of the advantages of the invention without departing from the true scope of the invention.

What is claimed is:

1. An integrated circuit comprising: a substrate;

a super-capacitor supported by the substrate, the super-capacitor comprising a super-capacitor electrode and a shared electrode; and a battery supported by the substrate, the battery comprising a battery electrode and the shared electrode, wherein the super-capacitor and the battery form at least part of a monolithic integrated circuit and wherein a portion of the super-capacitor electrode or the battery electrode is between at least two portions of the other of the battery electrode or the super-capacitor electrode.

2. The integrated circuit as defined by claim 1 wherein the battery and super-capacitor are electrically connected in parallel.

3. The integrated circuit as defined by claim 1 wherein the shared electrode is formed at least in part from a material so that it has surface energy storage capability and substantially no volumetric storage capability, the shared electrode comprising a shared anode for both the super-capacitor and the battery.

4. The integrated circuit as defined by claim 1 wherein the shared electrode comprises a material having both surface energy storage capability and volumetric energy storage capability, the super-capacitor forming an asymmetric super-capacitor, the shared electrode forming a shared cathode for the super-capacitor and the battery.

5. The integrated circuit as defined by claim 1 further comprising at least one of active circuitry and MEMS structure supported by the substrate and in electrical communication with the battery and the super-capacitor.

6. The integrated circuit as defined by claim 1 wherein the integrated circuit comprises a plurality of layers, at least one of the layers including two of the electrodes.

7. The integrated circuit as defined by claim 1 further comprising switching circuitry to switch between at least a) a first state using the battery only, and b) a second state using the super-capacitor only, and c) a third state connecting the super-capacitor and battery.

8. The integrated circuit as defined by claim 1 wherein the super-capacitor electrode comprises graphene and the battery electrode comprises graphite.

9. An integrated circuit comprising: electrolyte material;

a shared electrode connected to the electrolyte material;

a substrate having a monolithic integrated circuit formed thereon;

a super-capacitor electrode connected to the substrate and the electrolyte material with the electrolyte material between the super-capacitor electrode and the shared electrode; and a battery electrode connected to the substrate and the electrolyte material and substantially co-planar with the super-capacitor electrode, wherein the battery electrode includes a portion between two portions of the super-capacitor electrode and/or the super-capacitor electrode includes a portion between two portions of the battery electrode.

10. The integrated circuit as defined by claim 9 wherein the battery electrode and super-capacitor electrode are electrically connected in parallel.

11. The integrated circuit as defined by claim 9 wherein the shared electrode is formed at least in part from a material so that it has surface energy storage capability and substantially no volumetric storage capability, the shared electrode comprising a shared anode for both the super-capacitor electrode and the battery electrode.

12. The integrated circuit as defined by claim 9 wherein the shared electrode comprises a material having both surface energy storage capability and volumetric energy storage capability, the super-capacitor electrode and the shared electrode forming an asymmetric super-capacitor, the shared electrode forming a shared cathode for the super-capacitor electrode and the battery electrode.

13. The integrated circuit as defined by claim 9 further comprising at least one of active circuitry and MEMS structure supported by the substrate and in electrical communication with the battery electrode and the super-capacitor electrode.

14. The integrated circuit as defined by claim 9 wherein the super-capacitor electrode and the battery electrode are in one layer supported by the substrate.

15. The integrated circuit as defined by claim 14 wherein the super-capacitor electrode has a portion that is interdigitated with a portion of the battery electrode.

16. The integrated circuit as defined by claim 9 further comprising switching circuitry to switch between at least a) a first state using the battery electrode and the shared electrode only, and b) a second state using the super-capacitor electrode and the shared electrode only, and c) a third state connecting the super-capacitor electrode and the battery electrode.

17. The integrated circuit as defined by claim 9 wherein the super-capacitor electrode comprises graphene and the battery electrode comprises graphite.

18. The integrated circuit as defined by claim 9 further comprising a cap on the substrate covering the shared electrode, super-capacitor electrode and battery electrode wherein the electrolyte fills the cap such that the electrolyte envelops the shared electrode.

19. The integrated circuit as defined by claim 9 wherein the electrolyte comprises a solid electrolyte.

20. The integrated circuit as defined by claim 9 further comprising a current collector layer adjacent to and in electrical contact with the shared electrode.

* * * * *